(12) United States Patent
Inada et al.

(10) Patent No.: US 8,772,801 B2
(45) Date of Patent: Jul. 8, 2014

(54) LIGHT EMITTING ELEMENT AND OPTICAL DEVICE

(71) Applicant: Sumitomo Electric Industries, Ltd., Osaka (JP)

(72) Inventors: Hiroshi Inada, Yokohama (JP); Sundararajan Balasekaran, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/830,236

(22) Filed: Mar. 14, 2013

(65) Prior Publication Data

US 2014/0042389 A1    Feb. 13, 2014

(30) Foreign Application Priority Data

Aug. 10, 2012  (JP) ................................. 2012-178868

(51) Int. Cl.
  *H01L 33/00*    (2010.01)
  *H01L 29/06*    (2006.01)

(52) U.S. Cl.
  USPC ................... 257/97; 257/13; 257/E33.008

(58) Field of Classification Search
  CPC .............................. H01L 33/06; H01L 33/30
  USPC .......................................................... 257/97
  See application file for complete search history.

(56) References Cited

U.S. PATENT DOCUMENTS

| | | | | |
|---|---|---|---|---|
| 4,088,515 | A | * | 5/1978 | Blakeslee et al. ................ 117/91 |
| 2003/0071265 | A1 | * | 4/2003 | Thompson et al. .............. 257/79 |
| 2007/0248135 | A1 | * | 10/2007 | Mawst et al. ............. 372/45.011 |
| 2008/0315244 | A1 | * | 12/2008 | Kim et al. ...................... 257/101 |
| 2009/0302307 | A1 | * | 12/2009 | Gronninger et al. ............. 257/13 |

OTHER PUBLICATIONS

Kyosemi Corporation, catalog, InGaAsP infrared Led KEDE1542H (2 pages).
Keystone International Co., Ltd., catalog, New Mid Infrared Products, (38 pages.).
M. Peter et al., "Light-emitting diodes and laser diodes based on a $Ga_{1-x}In_xAs/GaAs_{1-y}Sb_y$ type II superlattice on InP substrate," Applied Physics Letters, vol. 74, No. 14, Apr. 1999, pp. 1951-1953.
H. Takasaki et al., "Electroluminescence of $In_{0.53}Ga_{0.47}As/GaAs_{0.55}b_{0.5}$ type II mulitple quantum well diodes lattice-matched to InP," Journal of Crystal Growth, 227-228 (2001), pp. 294-297.

* cited by examiner

*Primary Examiner* — Daniel Luke
(74) *Attorney, Agent, or Firm* — Venable LLP; Michael A. Sartori (57) ABSTRACT

An active layer having a type 2 multi-quantum well structure includes a plurality of pair thickness groups having different thicknesses, including a first pair thickness group and a second pair thickness group. The first pair thickness group $g_1$ includes 10 to 100 pairs, each monolayer of the pairs having a thickness of 1.5 nm or more and less than 3.5 nm. The second pair thickness group $g_2$ includes 10 to 100 pairs, each monolayer of the pairs having a thickness of the minimum thickness (a second group minimum thickness) or more and 7 nm or less, the minimum thickness being larger than the maximum monolayer thickness 3.5 nm of the first pair thickness group.

7 Claims, 6 Drawing Sheets

LIGHT EMITTING ELEMENT AND OPTICAL DEVICE

BACKGROUND OF THE INVENTION

1. Field of the Invention

The present invention relates to a light-emitting element and an optical device and more particularly to a light-emitting element for emitting light in a near-infrared region formed on a III-V group compound semiconductor substrate and an optical device.

2. Description of the Related Art

Light in a near-infrared region is used in texture observation of animals and plants, communication, and night photography. Thus, near-infrared light-receiving elements and light-emitting elements are being studied and developed. In particular, regarding light-emitting elements, InGaAsP light-emitting diodes (LEDs) for use in optical communication wavelength regions and near-infrared light-emitting diodes having an emission wavelength of 2.0 µm or more formed on a GaSb substrate are commercially available (Kyosemi Corporation, catalog, InGaAsP infrared LED KEDE1542H and Keystone International Co., Ltd., catalog, NEW MID INFRARED PRODUCTS).

Light-emitting elements having a multi-quantum well (MQW) structure mainly have a type 1 multi-quantum well structure. However, it is suitable for near-infrared light-emitting elements to have a type 2 MQW structure. Because of its high transition probability, light emission in the type 1 multi-quantum well structure has sufficient luminescence intensity even when the active layer has a small thickness or a small number of pairs. In the case of light emission in the type 2 multi-quantum well structure, two types of semiconductors having a large band gap can be used to make a transition for emitting near-infrared light corresponding to a narrow band gap. Since the transition probability is low, however, the number of pairs must be increased to achieve sufficient luminescence intensity. An increase in the number of pairs results in the accumulation of defects in the quantum well, making it difficult to achieve high crystallinity.

M. Peter, et al. discloses an active layer composed of a type 2 multi-quantum well structure of 10 to 20 InGaAs/GaAsSb pairs as an example of InP compound semiconductor light-emitting diodes (LEDs) and laser diodes (LDs) (M. Peter, et al., "Light-emitting diodes and laser diodes based on a $Ga_{1-x}In_xAs/GaAs_{1-y}Sb_y$ type II superlattice on a InP substrate", Appl. Phys. Lett., Vol. 74, No. 14, 5 Apr. 1999). The number of pairs is limited because of the reason described above. An epitaxial layered body is grown on an InP substrate by metal-organic vapor phase epitaxy (MOVPE).

H. Takasaki, et al., reported the observation of electroluminescence having a center wavelength of 2.4 µm from an InGaAs/GaAsSb type 2 multi-quantum well structure at room temperature (H. Takasaki, et al., "Electroluminescence of $In_{0.53}Ga_{0.47}As/GaAs_{0.5}Sb_{0.5}$ type II multiple quantum well diodes lattice-matched to InP", Journal of Crystal Growth, 227-228 (2001), 294-297).

Because of their narrow bands and low intensities of light, the LEDs and other devices described above are not used in practical analytical apparatuses (optical devices). For example, halogen lamps and supercontinuum (SC) light sources are used for analyses of proteins having a plurality of absorption bands. Although halogen lamps can emit light in a wide near-infrared region, they generate excessive heat and alter the quality of the target organic substances, such as proteins. Supercontinuum light sources can emit light in a wide wavelength range based on a non-linear phenomenon by supplying single-wavelength light having a very high energy density through an optical fiber. However, supercontinuum light sources are expensive.

SUMMARY OF THE INVENTION

It is an object of the present invention to provide a light-emitting element that generates less heat, has excellent economic viability, and emit light in a wide wavelength range that cannot be produced with a common multi-quantum well structure. It is another object of the present invention to provide an optical device including the light-emitting element.

A light-emitting element according to one aspect of the present invention is a near-infrared light-emitting element formed on a III-V group compound semiconductor substrate. The light-emitting element includes an active layer having a multi-quantum well (MQW) structure, the multi-quantum well structure including layered type 2 pairs, and an upper cladding layer and a lower cladding layer disposed on opposite sides of the active layer, the upper cladding layer being more distant from the substrate than the lower cladding layer. The type 2 pairs include a plurality of pair thickness groups having different thicknesses, including a first pair thickness group and a second pair thickness group. The first pair thickness group includes 10 pairs or more and 100 pairs or less, each monolayer of the pairs having a thickness of 1.5 nm or more and less than 3.5 nm. The second pair thickness group includes 10 pairs or more and 100 pairs or less, each monolayer of the pairs having a thickness of the minimum thickness (a second group minimum thickness) or more and 7 nm or less, the minimum thickness being larger than the maximum monolayer thickness 3.5 nm of the first pair thickness group. The light-emitting element has an emission wavelength of 1.7 µm or more and 3.0 µM or less.

A decrease in the monolayer thickness of the pairs in the type 2 multi-quantum well structure tends to result in a decrease in emission wavelength. Accordingly, the first pair thickness group has a shorter emission wavelength than the second thickness group, and the second thickness group has a longer emission wavelength. Thus, the light-emitting element can emit light in a wide wavelength range by combining the first pair thickness group having a monolayer thickness of 1.5 nm or more and less than 3.5 nm with the second thickness group having a monolayer thickness of the minimum thickness (which is larger than the maximum monolayer thickness of the first pair thickness group) or more and 7 nm or less.

Transition in the type 2 multi-quantum well structure is indirect transition between adjacent layers and has low transition probability. Thus, the number of pairs can be increased to increase the number of recombination carriers. Sufficient luminescence intensity can be achieved with 10 or more and 100 or less pairs, preferably 30 or more pairs.

The pair thickness groups each including 10 pairs or more and 100 pairs or less are arranged in serious and made block in the multi-quantum well structure or the active layer.

The pair thickness groups are not limited to the first thickness group and the second thickness group. In other words, the pair thickness groups include at least the first thickness group and the second thickness group.

Each of the pair thickness groups may have the same monolayer thickness or different monolayer thicknesses. For example, a pair (x/y) in the first pair thickness group has the same thickness, such as (3.0 nm/3.0 nm), or different thicknesses, such as (2.5 nm/2.0 nm) or (3.0 nm/2.0 nm).

The terms "maximum" and "minimum", as used herein, are not used in the mathematically strict sense and refer to the maximum value and the minimum value in the corresponding thickness range or the maximum set value and the minimum set value in the target group. Without being bound by strict wording, these terms should be interpreted in accordance with the gist of the present invention.

The type 2 pairs may further include a third pair thickness group. The third pair thickness group includes 10 pairs or more and 100 pairs or less. Each monolayer of the pairs of the third pair thickness group has a thickness of 3.5 nm or more and less than the second group minimum thickness.

The third pair thickness group can give light emission in an intermediate wavelength region for complement the intermediate wavelength between the wavelength region of the first pair thickness group and the wavelength region of the second pair thickness group.

The monolayer thickness of each of the pair thickness groups may decrease in a direction from the lower cladding layer to the upper cladding layer.

With decreasing distance from an epitaxial layer surface (emergent surface), the emission wavelength decreases, and substantial band gap energy increases. Thus, light emitted away from the emergent surface is not absorbed on the way to the emergent surface. This can increase luminescence intensity on the whole.

The third pair thickness group may be disposed between the first pair thickness group and the second pair thickness group, and the number of pairs of the third pair thickness group may be smaller than the number of pairs of the first pair thickness group and the number of pairs of the second pair thickness group.

Although light emission in the intermediate wavelength region mainly depends on the third pair thickness group, the light emission also partly involves light emission in a short-wavelength region of the first pair thickness group and a long-wavelength region of the second pair thickness group. When the number of pairs of the third pair thickness group is similar to the number of pairs of the first or second pair thickness group, light emission in the intermediate wavelength region becomes excessive. It is desirable for light sources for optical devices of analyzers and analytical apparatuses to have moderate light emission in a predetermined wavelength region, particularly in the intermediate wavelength region. When the number of pairs of the third pair thickness group is smaller than the number of pairs of the first or second pair thickness group, light emission in the intermediate wavelength region becomes moderate.

The light-emitting element may further include an InGaAs contact layer in contact with the upper cladding layer and in ohmic contact with a positive electrode, wherein the substrate is an InP substrate, the multi-quantum well structure is a type 2 pair (InGaAs/GaAsSb) multilayer structure, and each of the upper cladding layer and the lower cladding layer is an InP layer or an InAlAs layer.

This structure allows the InP layer or the InAlAs layer having a large band gap energy to be used as the upper and lower cladding layers disposed on opposite sides of the active layer while maintaining lattice matching with the InP substrate having technological accumulation. Use of an InGaAs layer having a relatively small band gap and transparent to light from the active layer as the contact layer can easily realize ohmic contact with the positive electrode.

The positive electrode may be disposed on part of the InGaAs contact layer. A flat negative electrode may be disposed on the back side of the InP substrate. The light-emitting element may have a cleaved side surface.

This can prevent light from outgoing from the back side or the side surfaces while controlling the total luminescence intensity via an electric current, allowing light to exit efficiently from the epitaxial layer surface. The shape of the positive electrode may be partially opened shape like as circular or interspersed so as not to block light emission.

An optical device according to an aspect of the present invention includes a light-emitting element according to an aspect of the present invention as a light source.

The optical device can be used to precisely and efficiently analyze organic substances, such as proteins, in combination with a light source having a wide near-infrared emission characteristics.

The present invention can provide a light-emitting element that generates less heat, has excellent economic viability, and emit light in a wide wavelength range that cannot be produced with a common multi-quantum well structure.

DESCRIPTION OF THE PREFERRED EMBODIMENTS

First Embodiment

Figure 1:
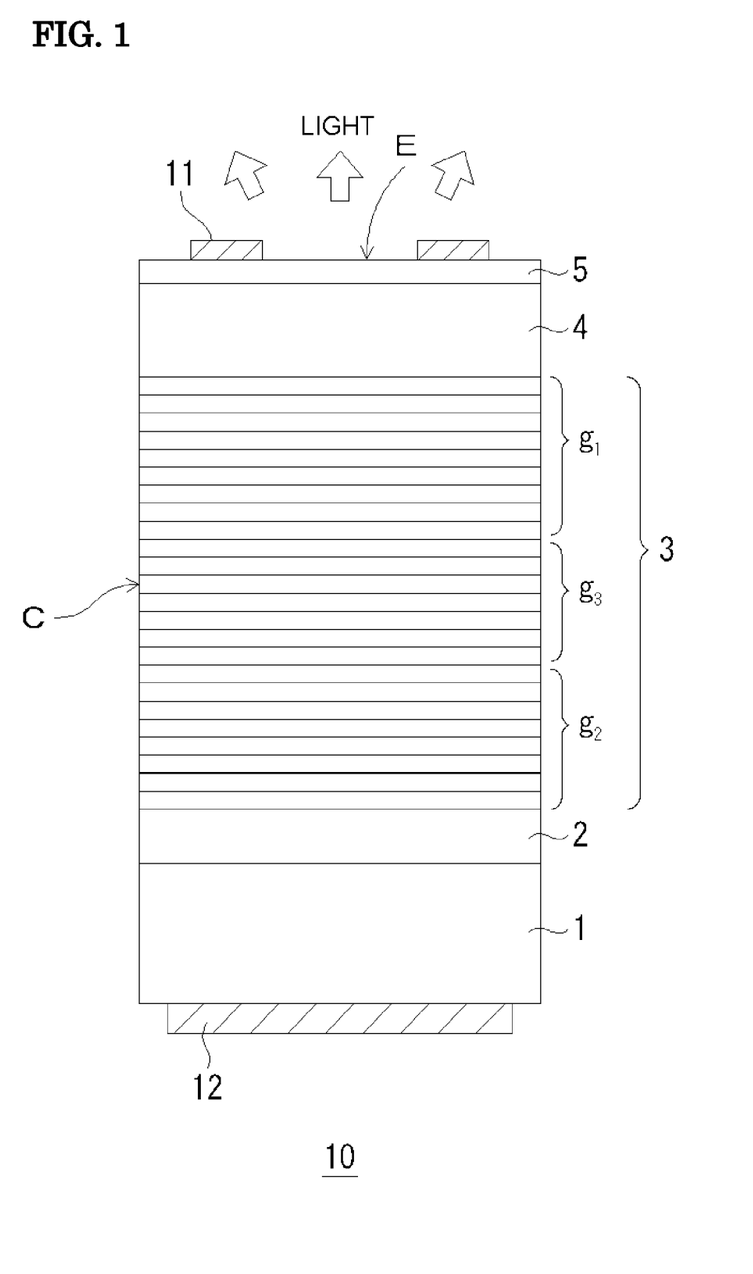
FIG. 1 is a schematic view of a light-emitting element according to a first embodiment of the present invention.

FIG. 1 is a cross-sectional view of a light-emitting element 10 according to a first embodiment of the present invention. The light-emitting element 10 has the following semiconductor layered structure.

n-type InP substrate 1/InP lower cladding layer 2/second pair thickness group $g_2$/third pair thickness group $g_3$/first pair thickness group $g_1$/InP upper cladding layer 4/p-type InGaAs contact layer 5

An active layer 3 is a type 2 pair (InGaAs/GaAsSb) layered body. An InGaAs layer (not shown) is disposed between the InP lower cladding layer 2 and the active layer 3. The second pair thickness group $g_2$/the third pair thickness group $g_3$/the first pair thickness group $g_1$ in the semiconductor layered structure will be described in detail below.

<Second Pair Thickness Group $g_2$: Pair Thickness Group Having Largest Thickness>

The second pair thickness group $g_2$ includes 49 pairs of (InGaAs having a thickness of 5 nm/GaAsSb having a thickness of 5 nm). The second pair thickness group $g_2$ has the largest thickness in the active layer 3. Although the InGaAs thickness and the GaAsSb thickness are 5 nm in this embodiment, they may be different. The thickness of each pair in the same pair thickness group may be different, provided that the monolayer thickness of the pairs is a predetermined minimum thickness (for example, 4.5 nm) or more and 7 nm or less.

<Third Pair Thickness Group $g_3$: Pair Thickness Group Having Intermediate Thickness>

The third pair thickness group $g_3$ includes 49 pairs of (InGaAs having a thickness of 4 nm/GaAsSb having a thickness of 4 nm). The third pair thickness group $g_3$ has an intermediate thickness in the active layer 3.

<First Pair Thickness Group $g_1$: Pair Thickness Group Having Smallest Thickness>

The first pair thickness group $g_1$ includes 49 pairs of (InGaAs having a thickness of 3 nm/GaAsSb having a thickness of 3 nm). The first pair thickness group $g_1$ has the smallest thickness in the active layer 3.

Figure 2:
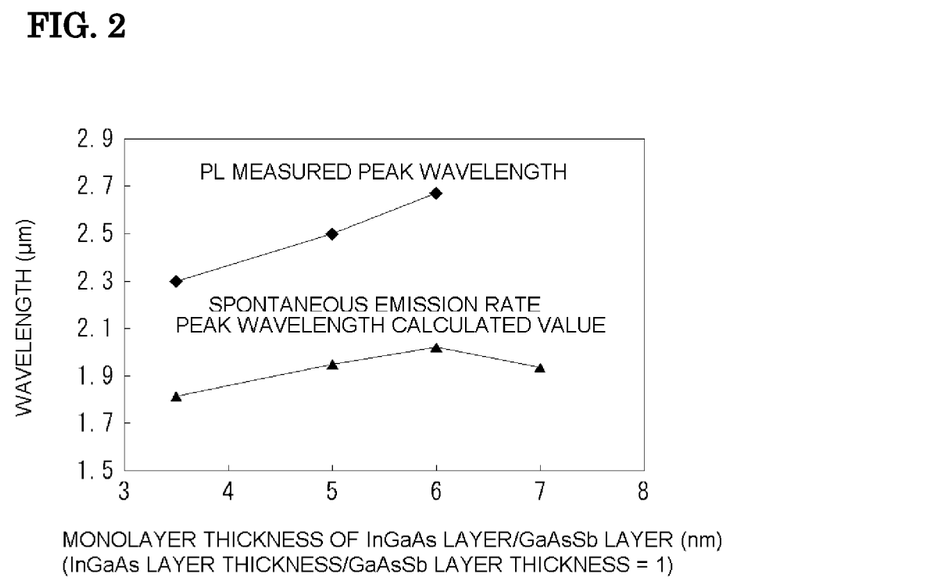
FIG. 2 is a graph of the relationship between the photoluminescence wavelength and the monolayer thickness of a type 2 (InGaAs/GaAsSb) multi-quantum well structure.

In order to explain a positional relationship between the pair thickness groups in the active layer 3, FIG. 2 shows the relationship between the pair thickness and the measured peak wavelength of a photoluminescence spectrum for the type 2 (InGaAs/GaAsSb) multi-quantum well structure. The pair thickness refers to the monolayer thickness of pairs having the same thickness. FIG. 2 shows that the peak wavelength increases with increasing monolayer thickness.

There is the following supposition with respect to the phenomenon in which the photoluminescence wavelength increases with increasing monolayer thickness. Light emission occurs when electrons of an electric current flowing between a positive electrode 11 and a negative electrode 12 make indirect transition from the conduction band of the InGaAs layer to the valence band of the GaAsSb layer in the active layer 3. The intrinsic energy levels of electrons in the type 2 (InGaAs/GaAsSb) multi-quantum well structure are formed in a potential well of the conduction band of the InGaAs layer by electrons being confined in that. The intrinsic energy levels of holes are formed in a potential well of the valence band of the GaAsSb layer. In the type 2 multi-quantum well structure, when the monolayers have a small thickness, for example, of 3 nm, electrons are confined in the narrow potential well, and the intrinsic energy of electrons formed in a narrow potential well of the InGaAs layer shifts to a higher energy level, and the intrinsic level of holes shifts in the opposite direction (away from the conduction band) such that the holes are confined in a potential well of the valence band of the GaAsSb layer. This increases the difference between the lowest energy level of the conduction band of the InGaAs layer and the highest energy level of the valence band of the GaAsSb layer.

Figure 3:
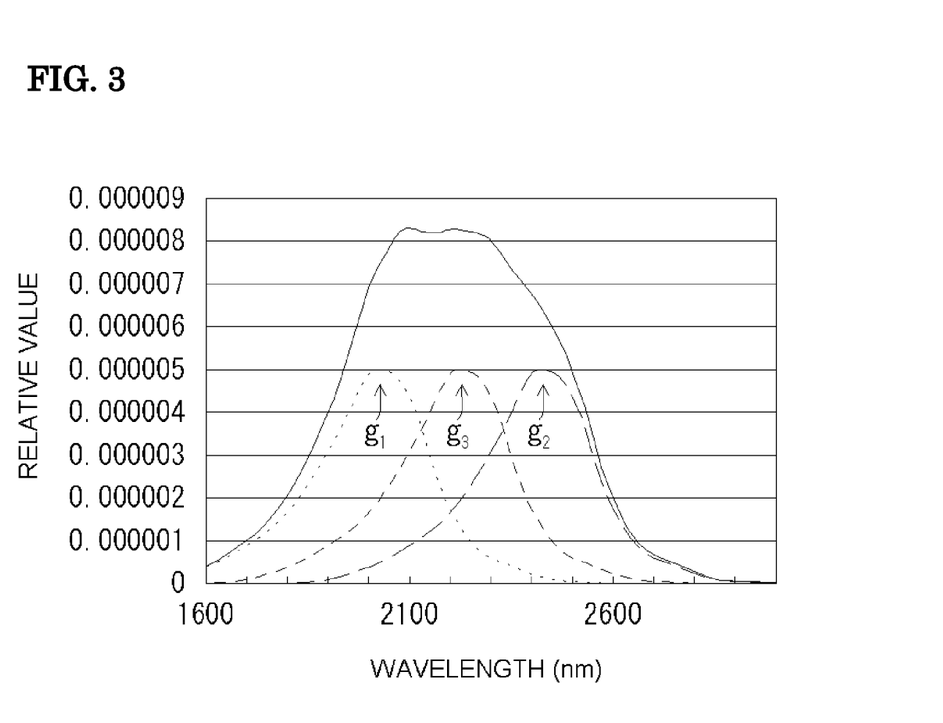
FIG. 3 is a graph of the emission spectra of the light-emitting element illustrated in FIG. 1.

The solid line in FIG. 3 indicates an emission spectrum of the light-emitting element 10 illustrated in FIG. 1. The emission spectrum has an emission band having a full width at half maximum (FWHM) in the range of 1800 to 2500 nm, thus covering a very wide near-infrared wavelength region. Practical light sources that can cover such a wide near-infrared wavelength region are limited to halogen lamps and supercontinuum (SC) light sources. However, halogen lamps generate much heat and alter the quality of proteins in protein analyses. Although supercontinuum light sources generate less heat, they require a strong excitation light source for causing a non-linear optical phenomenon, which makes the supercontinuum light sources expensive. The light-emitting element 10 illustrated in FIG. 1 is a light-emitting diode (LED), which wastes little energy as heat and consumes most energy for light emission. Like LEDs for household use, the light-emitting element 10 has a simple structure and only requires a change in electric current.

<Characteristics of Light-Emitting Element according to Embodiment of Present Invention>

In accordance with the supposition for explaining the phenomenon illustrated in FIG. 2, the first pair thickness group $g_1$ has the shortest cut-off wavelength (the largest transition energy difference). As viewed from the emergent surface, the third pair thickness group $g_3$ is disposed in the rear of the first pair thickness group $g_1$, and the second pair thickness group $g_2$ is disposed in the rear of the third pair thickness group $g_3$.

In order to gain a better understanding of the light-emitting element 10 according to the first embodiment of the present invention, a model of a pair thickness group will be discussed below.

Discussion on Model

Discussion (1)

Light emitted from the second pair thickness group $g_2$ is not absorbed by the other pair thickness groups in the active layer 3 irrespective of the position of the second pair thickness group $g_2$ in the active layer 3 (whether the second pair thickness group $g_2$ is closest to or farthest from the emergent surface E).

Discussion (2)

In the case that the second pair thickness group $g_2$ is closest to the emergent surface E in the active layer 3, the second pair thickness group $g_2$ always absorbs light emitted toward the emergent surface E from a pair thickness group of monolayers having a smaller thickness disposed in the rear. The second pair thickness group $g_2$ absorbs light emitted directly toward the emergent surface E from a pair thickness group having a smaller thickness disposed in the rear as well as light reflected by a side surface (cleaved surface) or the back side of the substrate.

Discussion (3)

In the case that the first pair thickness group $g_1$ having the smallest monolayer thickness is farthest from the emergent surface E (closest to the InP substrate 1), light emitted from the first pair thickness group $g_1$ is absorbed by the second and third pair thickness groups $g_2$ and $g_3$, which are closer to the emergent surface E than the first pair thickness group $g_1$, irrespective of the light path. Light emitted directly toward the emergent surface E from the first pair thickness group $g_1$, light reflected by the negative electrode 12 on the back side of the InP substrate 1 toward the emergent surface E, and light reflected by a cleaved side surface C toward the emergent surface E are absorbed by the second and third pair thickness groups $g_2$ and $g_3$.

The characteristics of a light-emitting element according to the present embodiment will be described below on the basis of the discussions on the model described above.

I. Structural Characteristics of Light-Emitting Element Illustrated in FIG. 1:

(1) The second pair thickness group $g_2$ having the largest thickness is farthest from the emergent surface E, and the first pair thickness group $g_1$ having the smallest thickness is closest to the emergent surface E.

The third pair thickness group $g_3$ having the intermediate thickness is disposed between the first pair thickness group $g_1$ and the second pair thickness group $g_2$. The three pair thickness groups $g_1$, $g_2$, and $g_3$ having different thicknesses are basically layered.

(2) As described in Discussion (1), light in the longest-wavelength region emitted from the second pair thickness group $g_2$ is not absorbed by the third pair thickness group $g_3$ or the first pair thickness group $g_1$ before emission from the emergent surface E.

(3) Among light rays from the first pair thickness group $g_1$, at least light emitted directly toward the emergent surface E is not absorbed in the active layer 3. Light reflected by the negative electrode 12 toward the InP substrate 1 is absorbed by the third and second pair thickness groups $g_3$ and $g_2$.

Among light rays from the third pair thickness group $g_3$, at least light emitted directly toward the emergent surface E is not absorbed by the first pair thickness group $g_1$.

(4) An increase in pair thickness from the emergent surface E to the substrate results in a decrease in light absorption before light reaches the emergent surface E. Light is emitted in all directions from the active layer 3. With the arrangement of the pair thickness groups illustrated in FIG. 1, however, at least light emitted in the active layer 3 directly toward the emergent surface E is not absorbed in the active layer 3.

(5) The cut-off wavelengths of the InP substrate 1, the InP upper and lower cladding layers 2 and 4, and the InGaAs contact layer 5 are shorter than the wavelengths of light emitted from the first to third pair thickness groups $g_1$, $g_2$, and $g_3$. Thus, the InP substrate 1, the InP upper and lower cladding layers 2 and 4, and the InGaAs contact layer 5 do not absorb light emitted from the active layer 3. The positive electrode 11 is circular so as not to block light emission from the emergent surface E. The light-emitting element 10 has a cleaved side surface C and the negative electrode 12 made of a metal on the back side of the InP substrate 1. The negative electrode 12 reflects light.

As a result of (1) to (5) described above, input energy can be efficiently used to emit light.

II. Operational Characteristics (1) Efficient use of input energy for light emission can further reduce heat generation.

(2) Since light emitted directly toward the emergent surface E from the pair thickness groups are not absorbed, it is easy to control the entire light spectrum distribution.

Figure 4:
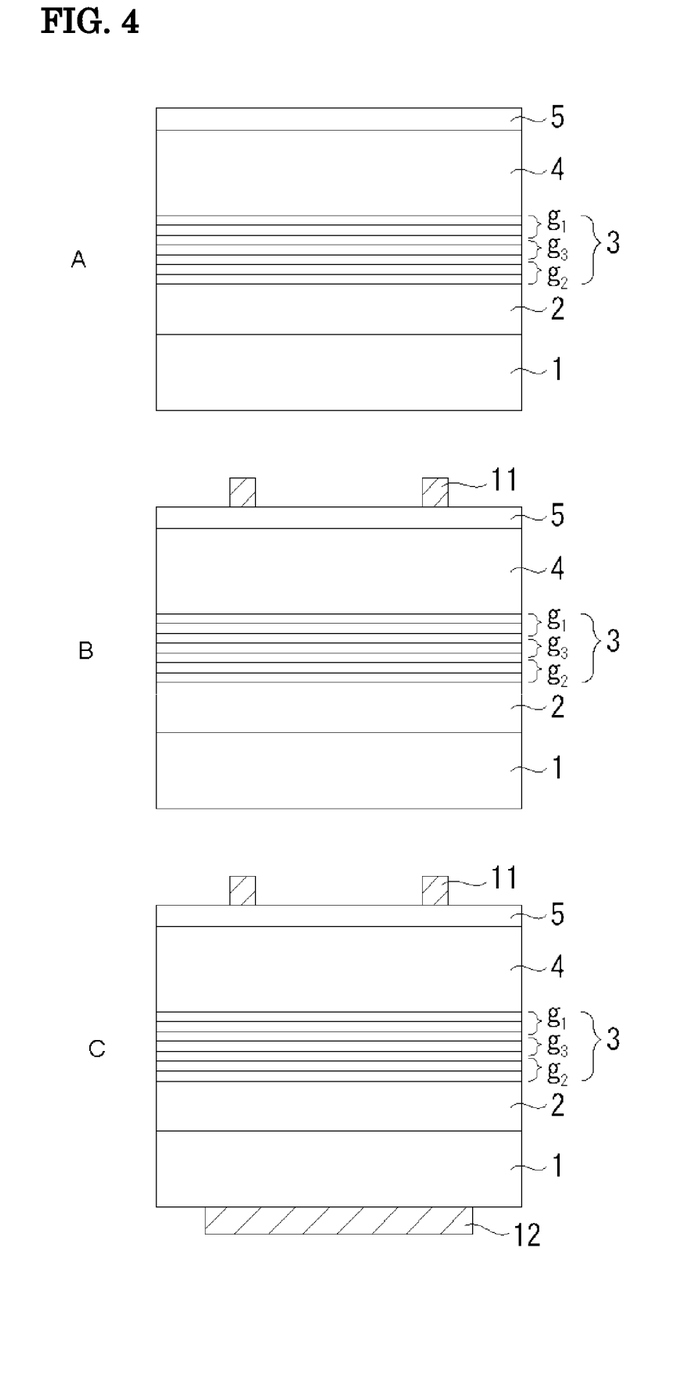
FIG. 4A is a schematic view illustrating a method for manufacturing the light-emitting element illustrated in FIG. 1, in which a semiconductor layer is epitaxially grown on an InP substrate.
FIG. 4B is a schematic view illustrating a method for manufacturing the light-emitting element illustrated in FIG. 1, in which a positive electrode is formed.
FIG. 4C is a schematic view illustrating a method for manufacturing the light-emitting element illustrated in FIG. 1, in which a negative electrode is formed on the back side of the InP substrate.

A method for manufacturing the light-emitting element illustrated in FIG. 1 will be described below. As illustrated in FIG. 4A, the InP lower cladding layer 2, the active layer 3 having the type 2 (InGaAs/GaAsSb) multi-quantum well structure, the InP upper cladding layer 4, and the InGaAs contact layer 5 are sequentially epitaxially grown on the sulfur (S)-doped InP substrate 1. As illustrated in FIG. 4B, the circular positive electrode 11 is then formed. In the formation of the positive electrode 11, the InGaAs contact layer 5 is first pre-etched with buffered hydrofluoric acid at room temperature for approximately 30 seconds. A resist is then coated to the InGaAs contact layer 5 and is exposed to light in a pattern of the circular positive electrode 11 to form a resist pattern. The resist pattern is then metallized. Three layers of Ti(100 nm)/Pt(50 nm)/Au(50 nm) are deposited so as to achieve ohmic contact with the InGaAs contact layer 5. Excess metal is removed by lift-off of the resist pattern. The three layers are then heat-treated. The negative electrode 12 is then formed on the back side of the InP substrate 1 by the deposition of a Au/Ge/Ni multilayer and heat treatment. The negative electrode 12 is in ohmic contact with the InP substrate 1. The negative electrode 12 may entirely cover the back side of the InP substrate 1 or, as illustrated in FIG. 4C, partly cover the back side of the InP substrate 1 with the periphery of the InP substrate 1 being exposed.

After the negative electrode 12 is formed, the light-emitting element is scribed and cleaved to form the cleaved side surface C.

Modified Example of First Embodiment

Figure 5:
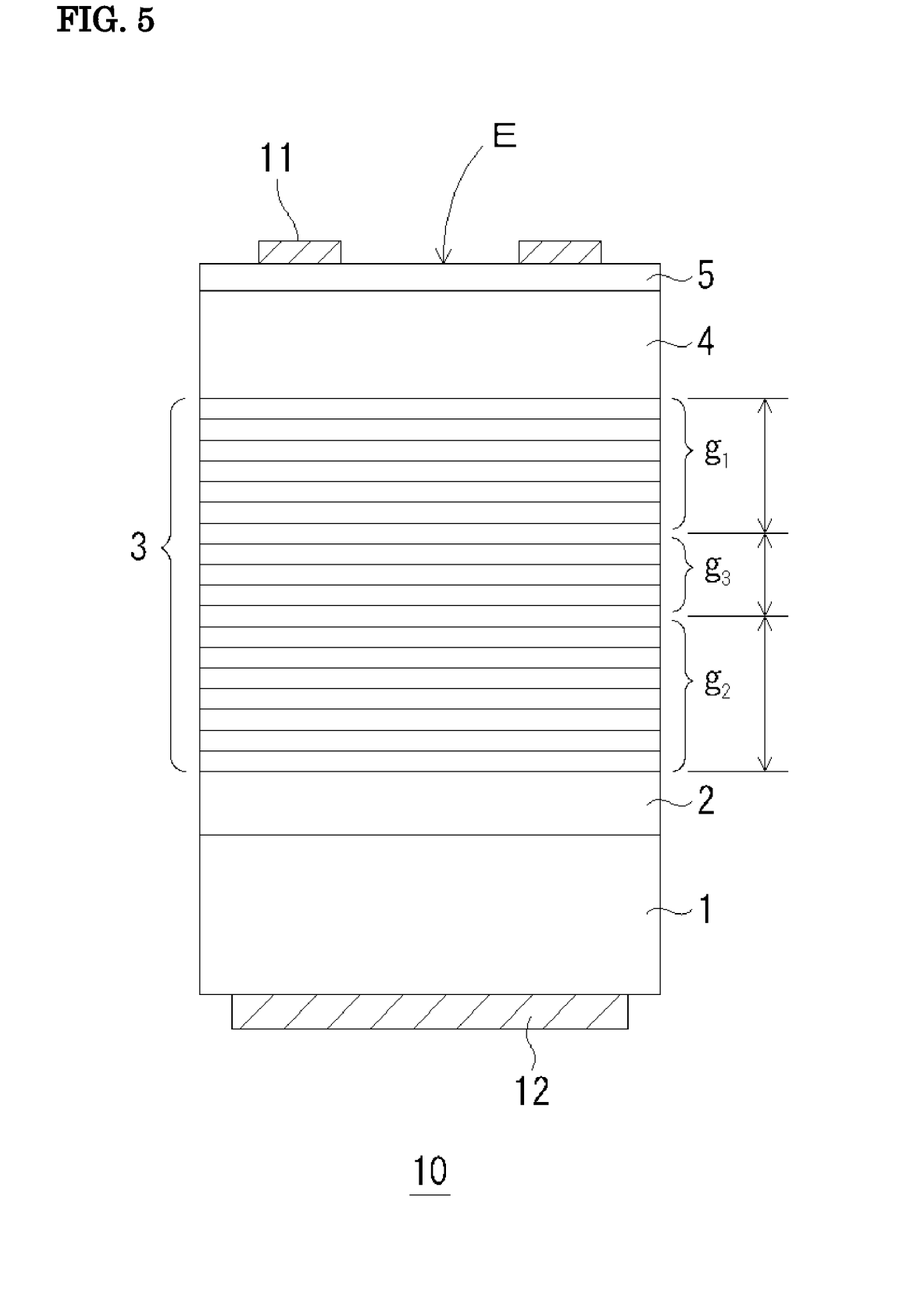
FIG. 5 is a schematic view of a modified example of the light-emitting element according to the first embodiment.

FIG. 5 is a schematic view of a light-emitting element 10 according to a modified example of the first embodiment of the present invention. The light-emitting element 10 illustrated in FIG. 5 is different from the light-emitting element 10 illustrated in FIG. 1 in that the third pair thickness group $g_3$ has a smaller thickness than the first and second pair thickness groups $g_1$ and $g_2$.

The smaller thickness of the third pair thickness group $g_3$ means a smaller number of pairs of the third pair thickness group $g_3$. The number of pairs of each of the pair thickness groups in the first embodiment is the same (49 pairs). However, the number of pairs of the third pair thickness group $g_3$ in the present modified example is 25, which is approximately half the number of pairs of each of the first and second pair thickness groups $g_1$ and $g_2$ (49 pairs).

Figure 6:
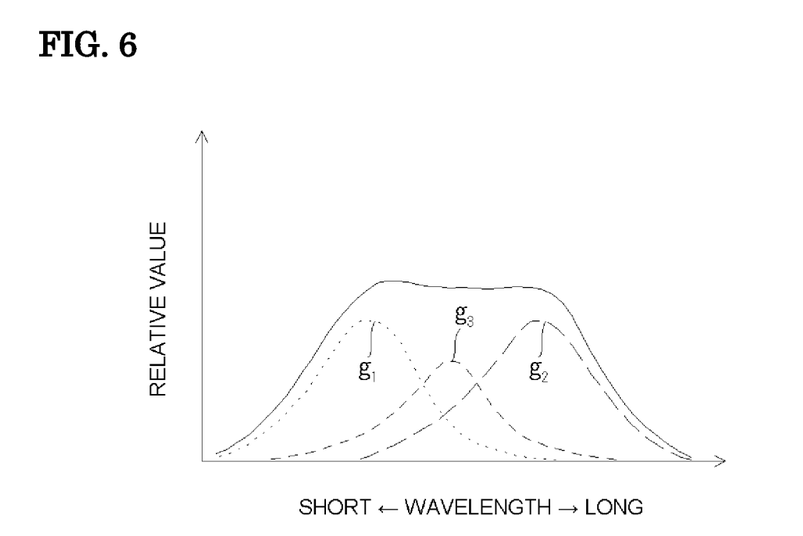
FIG. 6 is a graph of the emission spectra of the light-emitting element illustrated in FIG. 5.

FIG. 6 is a graph of the emission spectra of the light-emitting element 10 illustrated in FIG. 5. In response to the smaller number of pairs of the third pair thickness group $g_3$, light emission in the intermediate wavelength region has low intensity. Although the third pair thickness group $g_3$ mainly contributes to light intensity in the intermediate wavelength region, a short-wavelength region of the first pair thickness group $g_1$ and a long-wavelength region of the second pair thickness group $g_2$ also significantly contribute to light intensity in the intermediate wavelength region, as illustrated in FIGS. 3 and 6. When the number of pairs of the third pair thickness group $g_3$ is similar to the number of pairs of the first or second pair thickness group $g_1$ or $g_2$, light emission in the intermediate wavelength region becomes excessive, resulting in a mountain-shaped spectral distribution. It is desirable for light sources for optical devices of analyzers and analytical apparatuses to have moderate light emission in a predetermined wavelength region, particularly in the intermediate wavelength region. When the number of pairs of the third pair thickness group $g_3$ is smaller than the number of pairs of the first or second pair thickness group $g_1$ or $g_2$, light emission in the intermediate wavelength region becomes moderate.

Second Embodiment

Figure 7A:
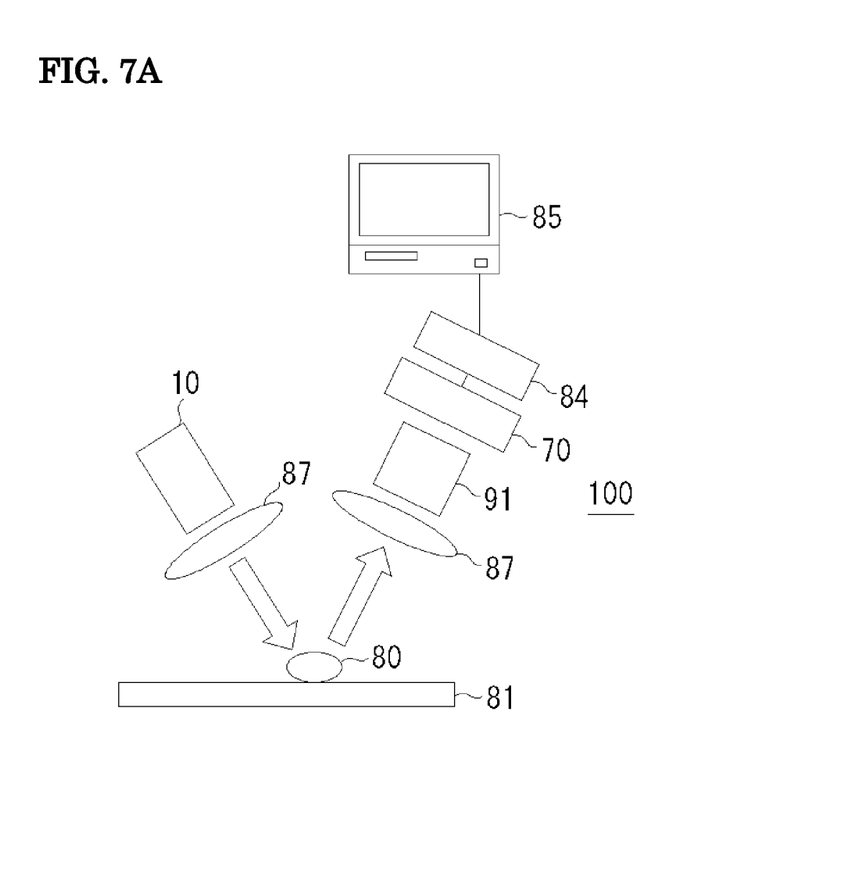
FIG. 7A is a schematic view of an optical device according to a second embodiment of the present invention.
Figure 7B:
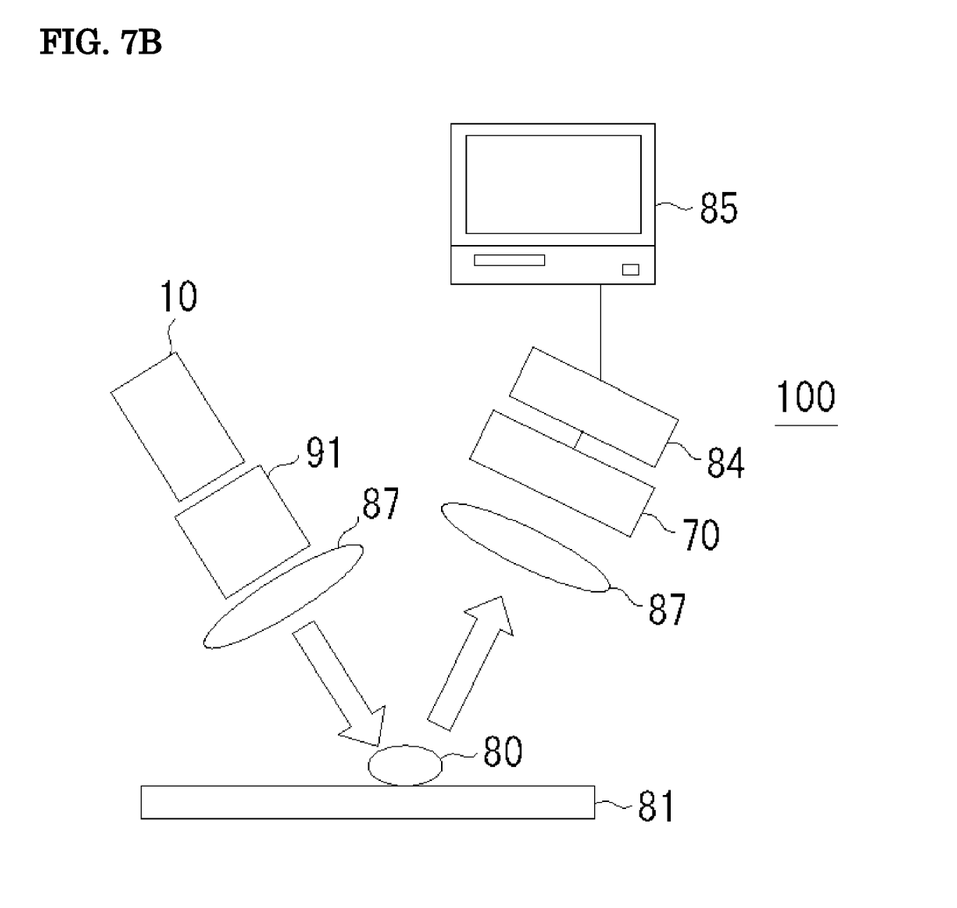
FIG. 7B is a schematic view of an optical device according to the second embodiment of the present invention.

FIGS. 7A and 7B are schematic views of an optical device 100 according to a second embodiment of the present invention. The optical device 100 includes the light-emitting element 10 illustrated in FIG. 1 or 5 in a light source. For example, the optical device 100 can be used to examine the thermal history of an egg without breaking its shell or identify the type of tablets in a press-through package without breaking its sheet. A sample 80 on a sample stage 81 is irradiated with near-infrared light emitted by the light-emitting element 10 illustrated in FIG. 1 or 5. The near-infrared light path in FIG. 7A is as follows: light source 10→converging lens 87→sample 80→converging lens 87→spectroscope 91→light-receiving image sensor 70→signal processer 84→image display apparatus 85.

The light-receiving image sensor 70 is a hybrid sensor composed of an InP light-receiving element array having responsivity in a near-infrared region and a read-out integrated circuit formed on silicon.

The light-emitting element 10 illustrated in FIG. 1 or 5 has the following advantages.

1. Because of a wide wavelength range of light in a near-infrared region emitted by the light-emitting element 10, a minute amount of protein in an organic substance can be identified with high precision. Many proteins have a plurality of absorption bands in a 2.0 μm wavelength range. Use of the light-emitting element 10 covering a wide wavelength range allows precise analysis of proteins using a plurality of absorption bands. More basically, a minute amount of protein that cannot be analyzed with an existing light source can be analyzed using the light-emitting element 10.

2. For example, in order to distinguish between a soft-boiled egg and an almost raw egg, it is undesirable for an egg of the sample 80 to experience heat generated by the light-emitting element 10. Heating of a sample resulting from a light source should be avoided also in the analysis of a minute amount of protein. The present invention can efficiently use input energy to emit light.

The optical device 100 illustrated in FIG. 7B is characterized in that the spectroscope 91 is disposed upstream of the sample 80. The optical device 100 illustrated in FIG. 7A or 7B may be selected for each purpose. The spectroscope 91 illustrated in FIG. 7A or 7B may be a diffraction grating or a prism.

Although the embodiments and examples of the present invention are described above, these embodiments and examples are presented only for the purpose of illustration and do not limit the scope of the present invention. The scope of the present invention is defined by the appended claims and embraces all changes that fall within the scope of the claims and the equivalents thereof.

The present invention can provide a light-emitting element that generates less heat, has excellent economic viability, and emit light in a wide wavelength range that cannot be produced with a common multi-quantum well structure. The light-emitting element is effective in precisely analyzing body tissues of animals and plants without heat generation. The light-emitting element is also effective for simplifying and enabling size reduction of optical devices and improving the economic viability of optical devices.

What is claimed is:

1. A near-infrared light-emitting element on a III-V group compound semiconductor substrate, comprising:
    an active layer having a multi-quantum well (MQW) structure, the multi-quantum well structure including layered type 2 pairs; and
    an upper cladding layer and a lower cladding layer disposed on opposite sides of the active layer, the upper cladding layer being more distant from the substrate than the lower cladding layer,
    wherein the type 2 pairs include a plurality of pair thickness groups having different thicknesses, including a first pair thickness group and a second pair thickness group,
    the first pair thickness group includes 10 pairs or more and 100 pairs or less, each monolayer of the pairs having a thickness of 1.5 nm or more and less than 3.5 nm,
    the second pair thickness group includes 10 pairs or more and 100 pairs or less, each monolayer of the pairs having a thickness of the minimum thickness (a second group minimum thickness) or more and 7 nm or less, the minimum thickness being larger than the maximum monolayer thickness 3.5 nm of the first pair thickness group, and
    the light-emitting element has an oscillation peak wavelength of 1.7 μm or more and 3.0 μm or less.

2. The light-emitting element according to claim 1, wherein the type 2 pairs further include a third pair thickness group including 10 pairs or more and 100 pairs or less, each monolayer of the pairs having a thickness of 3.5 nm or more and less than the second group minimum thickness.

3. The light-emitting element according to claim 2, wherein the monolayer thickness of each of the pair thickness groups decreases in a direction from the lower cladding layer to the upper cladding layer.

4. The light-emitting element according to claim 3, wherein the third pair thickness group is disposed between the first pair thickness group and the second pair thickness group, and the number of pairs of the third pair thickness group is smaller than the number of pairs of the first pair thickness group and the number of pairs of the second pair thickness group.

5. The light-emitting element according to claim 1, further comprising an InGaAs contact layer in contact with the upper cladding layer and in ohmic contact with a positive electrode, wherein the substrate is an InP substrate, the multi-quantum well structure is a type 2 pair (InGaAs/GaAsSb) multilayer structure, and each of the upper cladding layer and the lower cladding layer is an InP layer or an InAlAs layer.

6. The light-emitting element according to claim 5, wherein the positive electrode is disposed on part of the InGaAs contact layer, a flat negative electrode is disposed on the back side of the InP substrate, and the light-emitting element has a cleaved side surface.

7. An optical device, comprising the light-emitting element according to claim 1 as a light source.

* * * * *